(12) United States Patent
Fishburn

(10) Patent No.: US 12,207,458 B2
(45) Date of Patent: Jan. 21, 2025

(54) METHODS AND APPARATUS FOR HIERARCHICAL BITLINE FOR THREE-DIMENSIONAL DYNAMIC RANDOM-ACCESS MEMORY

(71) Applicant: Applied Materials, Inc., Santa Clara, CA (US)

(72) Inventor: Fredrick David Fishburn, Aptos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 591 days.

(21) Appl. No.: 17/680,993

(22) Filed: Feb. 25, 2022

(65) Prior Publication Data

US 2022/0285364 A1   Sep. 8, 2022

Related U.S. Application Data

(60) Provisional application No. 63/157,145, filed on Mar. 5, 2021.

(51) Int. Cl.
  *H10B 12/00* (2023.01)
(52) U.S. Cl.
  CPC .................................. *H10B 12/482* (2023.02)
(58) Field of Classification Search
  CPC ... H01L 29/66636; H10B 12/05; H10B 12/30; H10B 12/482; H10B 12/488
  See application file for complete search history.

(56) References Cited

U.S. PATENT DOCUMENTS

| 8,923,050 B2 | 12/2014 | Cernea et al. |
| 2006/0044901 A1 | 3/2006 | Joo et al. |
| 2006/0076625 A1* | 4/2006 | Lee ..................... H01L 29/7851 257/353 |
| 2016/0049489 A1* | 2/2016 | Wan .................. H01L 29/66545 438/157 |

* cited by examiner

Primary Examiner — Michelle Mandala
Assistant Examiner — Kevin Quinto
(74) Attorney, Agent, or Firm — MOSER TABOA

(57) ABSTRACT

Methods for forming 3D DRAM leverage L-pad formations to increase memory density. Methods may include etching a substrate to form two Si walls oriented parallel to each other and forming a space therebetween, depositing a plurality of alternating Si layers and SiGe layers using epitaxial growth processes to form horizontal deposition layers on the space between the two Si walls and vertical deposition layers on sidewalls of the two Si walls, depositing a CMP stop layer on the substrate, planarizing the substrate to the CMP stop layer, removing a portion of a top of the two Si walls and forming an L-pad formation, deep etching a pattern of holes into the space between the two Si walls in horizontal portions of the plurality of alternating Si layers and SiGe layers, and forming vertical wordline structures from the pattern of holes in the horizontal portions.

20 Claims, 10 Drawing Sheets

METHODS AND APPARATUS FOR HIERARCHICAL BITLINE FOR THREE-DIMENSIONAL DYNAMIC RANDOM-ACCESS MEMORY

CROSS-REFERENCE TO RELATED APPLICATIONS

This application claims the benefit of the U.S. provisional patent application Ser. No. 63/157,145, filed Mar. 5, 2021, which is herein incorporated by reference in its entirety.

FIELD

Embodiments of the present principles generally relate to semiconductor manufacturing.

BACKGROUND

The storage and retrieval of data has been a limiting factor for many aspects of the computing industry. Memory devices can throttle the performance of modern computing devices. To make memory faster, memory structures have been scaled down to miniscule sizes, dramatically increasing the density of the structures. Two-dimensional memory structures are starting to reach a theoretical limit with regard to the densities of the memory structures. The inventor has observed that three-dimensional memory structures may hold the key to further increasing memory densities. However, three-dimensional memory devices are currently much more expensive to fabricate than two-dimensional memory devices.

Accordingly, the inventor has provided methods and apparatus for three-dimensional memory architectures with hierarchical bitlines that allow memory and supporting circuit densities beyond the capabilities of current technologies.

SUMMARY

In some embodiments, a method of forming structures for three-dimensional (3D) dynamic random-access memory (DRAM) may comprise etching a substrate to form at least two silicon walls oriented parallel to each other and forming a space therebetween, wherein the at least two silicon walls have a first height, depositing a plurality of alternating crystalline silicon layers and crystalline silicon germanium layers using epitaxial growth processes to form horizontal deposition layers on the space between the at least two silicon walls and vertical deposition layers on sidewalls of the at least two silicon walls, depositing a chemical mechanical (CMP) stop layer on the substrate, and planarizing the substrate to the CMP stop layer, removing a portion of a top of the at least two silicon walls and forming an L-pad formation, wherein the at least two silicon walls have a second height after planarizing that is less than the first height.

In some embodiments, the method may further include deep etching a pattern of holes into the space between the at least two silicon walls in horizontal portions of the plurality of alternating crystalline silicon layers and crystalline silicon germanium layers and forming vertical wordline structures from the pattern of holes in the horizontal portions, etching at least two trenches perpendicular to one of the at least two silicon walls, the at least two trenches electrically isolating a global bitline access area formed in the L-pad formation, the global bitline access area configured to provide access to a portion of the plurality of alternating crystalline silicon layers and crystalline silicon germanium layers used to form the vertical wordline structures and replacing the crystalline silicon germanium layers of the global bitline access area with dielectric material and replacing the crystalline silicon layers of the global bitline access area with metal material to form metal bitlines, forming at least one global bitline perpendicular to the global bitline access area and distal to the one of the at least two silicon walls and adjacent to the vertical wordline structures, each one of the at least one global bitline electrically connected to one of at least one of the metal bitlines of the global bitline access area, forming at least one local bitline switch from at least one vertical wordline structure, the at least one local bitline switch configured to electrically connect and disconnect the at least one global bitline to local bitline interfacing with the vertical wordline structures, forming a bitline equilibrate adjacent to the vertical wordline structures but distal to the at least one global bitline and forming at least one bitline equilibrate switch from at least one vertical wordline structure, the at least one bitline equilibrate switch configured to electrically connect and disconnect local bitlines interfacing with the vertical wordline structures; selectively etching vertical portions of the crystalline silicon germanium layers of the L-pad formation to remove a portion of the crystalline silicon germanium layers between vertical portions of the crystalline silicon layers, selectively etching vertical portions of the crystalline silicon layers to reduce a thickness of the vertical portions of the crystalline silicon layers to form fins for at least one fin field-effect transistor, forming shallow trench isolation areas in the vertical portions of the crystalline silicon layers and the crystalline silicon germanium layers for the fin field-effect transistor, and forming nitride plugs in the shallow trench isolation areas for the fin field-effect transistor; wherein a first thickness of the at least two silicon walls is approximately 2 microns to approximately 3 microns, wherein the first height of the at least two silicon walls is approximately 2 microns to approximately 20 microns, wherein the first height of the at least two silicon walls is approximately 10 microns, wherein the space between the at least two silicon walls is approximately twice a length of a local bitline, and/or wherein the space between the at least two silicon walls is approximately 60 microns.

In some embodiments, a method of forming structures for three-dimensional (3D) dynamic random-access memory (DRAM) may comprise etching a substrate to form at least two silicon walls oriented parallel to each other and forming a space therebetween, wherein the at least two silicon walls have a first height, conformally depositing a plurality of alternating crystalline silicon layers and crystalline silicon germanium layers using epitaxial growth processes to form horizontal deposition layers on the space between the at least two silicon walls and vertical deposition layers on sidewalls of the at least two silicon walls, depositing a chemical mechanical (CMP) stop layer on the substrate, planarizing the substrate to the CMP stop layer, removing a portion of a top of the at least two silicon walls and forming an L-pad formation, wherein the at least two silicon walls have a second height after planarizing that is less than the first height, selectively etching vertical portions of the crystalline silicon germanium layers of the L-pad formation to remove a portion of the crystalline silicon germanium layers between vertical portions of the crystalline silicon layers, selectively etching vertical portions of the crystalline silicon layers to reduce a thickness of the vertical portions of the crystalline silicon layers to form fins for at least one fin field-effect transistor, forming shallow trench isolation areas in the vertical portions of the crystalline silicon layers and the crystalline silicon germanium layers for the fin field-effect transistor, and forming nitride plugs in the shallow trench isolation areas for the fin field-effect transistor.

In some embodiments, the method may further include wherein the thickness of the fins is approximately 10 nm to approximately 12 nm; depositing a first oxide layer on the crystalline silicon layers and the crystalline silicon germanium layers after selectively etching vertical portions of the crystalline silicon layers, densifying the first oxide layer, forming the shallow trench isolation areas by etching a least one portion of the first oxide layer to expose at least one end of a vertical crystalline silicon layer and etching the vertical crystalline silicon layer and adjacent vertical silicon germanium layers, and depositing a second oxide layer in the shallow trench isolation areas to partially fill the shallow trench isolation areas; and/or wherein a combined thickness of the first oxide layer and the second oxide layer in the shallow isolation areas is approximately 6 nm.

In some embodiments, a non-transitory, computer readable medium having instructions stored thereon that, when executed, cause a method of forming structures for three-dimensional (3D) dynamic random-access memory (DRAM) to be performed, the method may comprise etching a substrate to form at least two silicon walls oriented parallel to each other and forming a space therebetween, wherein the at least two silicon walls have a first height, depositing a plurality of alternating crystalline silicon layers and crystalline silicon germanium layers using epitaxial growth processes to form horizontal deposition layers on the space between the at least two silicon walls and vertical deposition layers on sidewalls of the at least two silicon walls, depositing a chemical mechanical (CMP) stop layer on the substrate, and planarizing the substrate to the CMP stop layer, removing a portion of a top of the at least two silicon walls and forming an L-pad formation, wherein the at least two silicon walls have a second height after planarizing that is less than the first height.

In some embodiments, the method on the non-transitory, computer readable medium may further include deep etching a pattern of holes into the space between the at least two silicon walls in horizontal portions of the plurality of alternating crystalline silicon layers and crystalline silicon germanium layers and forming vertical wordline structures from the pattern of holes in the horizontal portions; etching at least two trenches perpendicular to one of the at least two silicon walls, the at least two trenches electrically isolating a global bitline access area formed in the L-pad formation, the global bitline access area configured to provide access to a portion of the plurality of alternating crystalline silicon layers and crystalline silicon germanium layers used to form the vertical wordline structures, replacing the crystalline silicon germanium layers of the global bitline access area with dielectric material and replacing the crystalline silicon layers of the global bitline access area with metal material to form metal bitlines, forming at least one global bitline perpendicular to the global bitline access area and distal to the one of the at least two silicon walls and adjacent to the vertical wordline structures, each one of the at least one global bitline electrically connected to one of at least one of the metal bitlines of the global bitline access area, forming at least one local bitline switch from at least one vertical wordline structure, the at least one local bitline switch configured to electrically connect and disconnect the at least one global bitline to local bitline interfacing with the vertical wordline structures, forming a bitline equilibrate adjacent to the vertical wordline structures but distal to the at least one global bitline, and forming at least one bitline equilibrate switch from at least one vertical wordline structure, the at least one bitline equilibrate switch configured to electrically connect and disconnect local bitlines interfacing with the vertical wordline structures; and/or selectively etching vertical portions of the crystalline silicon germanium layers of the L-pad formation to remove a portion of the crystalline silicon germanium layers between vertical portions of the crystalline silicon layers, selectively etching vertical portions of the crystalline silicon layers to reduce a thickness of the vertical portions of the crystalline silicon layers to form fins for at least one fin field-effect transistor, forming shallow trench isolation areas in the vertical portions of the crystalline silicon layers and the crystalline silicon germanium layers for the fin field-effect transistor, and forming nitride plugs in the shallow trench isolation areas for the fin field-effect transistor.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
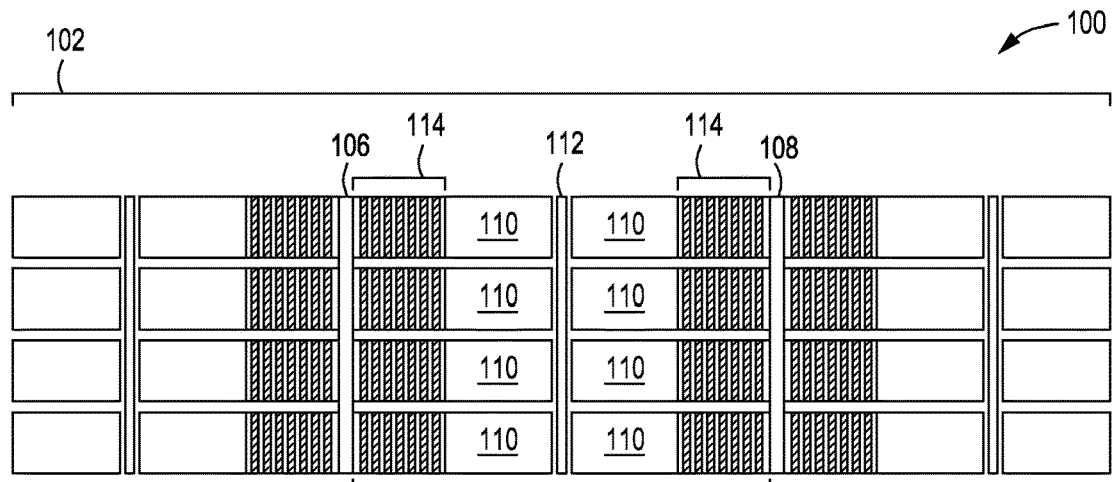
FIG. 1 depicts a top-down view of 3D DRAM arrays in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus enable three-dimensional (3D) dynamic random-access memory (DRAM) cells that use economical materials and process methods to produce memory arrays which can meet a D1d memory density of approximately 1300 um$^2$ per Megabit and beyond. Two-dimensional (2D) DRAM scaling is getting very difficult to manufacture and the cost is constantly increasing. Below the D1d DRAM node, the feature size will be so small that even self-aligned quadruple patterning (SAQP) will no longer be a viable option. Even if extreme ultraviolet (EUV) lithography is adopted, the EUV lithography will still need to be at least self-aligned double patterning (SADP), if not SAQP at most levels. Although 3D DRAM is a concept that is has been investigated widely in the DRAM industry for D1d and beyond, proposed solutions with different cell structures cannot be processed with economical materials and processes at the dimensions needed to reach memory density comparable to 2D DRAM.

The methods and apparatus of the present principles provide a 3D DRAM cell interconnection architecture that enables low bitline capacitance, integrated fin field-effect transistor's (FinFET) for sense amplifier circuitry, and hierarchical connections for bitlines to reduce the parasitic capacitance and resistance-capacitance (RC) delay response to surpass 2D DRAM capabilities. The present principles leverage vertical wordlines formed from alternating layers of silicon (Si) and silicon germanium (SiGe) to enable the following architecture features. In some embodiments, the vertical wordline access device structure may be used to create a switch to connect or disconnect a local bitline to a global bitline, and, in some cases, connect or disconnect the global bitline to a sense amplifier. In some embodiments, the vertical wordline access device structure may be used to create a switch to connect or disconnect a local bitline on an opposite end of a global bitline to short all local bitlines in a tier stack together and connect the local bitlines to bitline reference voltages, also known as the bitline EQ or bitline equilibrate.

The techniques of the present principles eliminate the need (and space) for staircase contact points by using an L-pad formation, allowing top level contacts with minimal surface area usage. The L-pad formation begins with a hole in a substrate at least as deep as a memory array and wider on all sides than the memory array by at least the tier stack thickness. The tier stack layers of alternating Si/SiGe are epitaxially grown on the sidewall as well as the bottom of the memory array. After deposition of the Si/SiGe layers, the Si/SiGe layers are planarized back to the original silicon surface. The planarization is performed such that the planarization stops below the original silicon height. Only a small width of the sidewall Si/SiGe stack is used for the interconnect to the memory array and forms the global bitline.

The techniques of the present principles may also be used to form ancillary structures such as FinFET structures in the sidewall portions of the Si/SiGe layers. After planarization, the Si/SiGe layers appear as alternating lines parallel to the array. The SiGe layers are recessed selectively to the Si layers to form Si fins of the FinFET. In some embodiments, some of the fins are removed and other fins are narrowed to a desired thickness. The formation of the FinFET structures allows creation of complementary metal-oxide-semiconductor (CMOS) sense amplifiers inside, for example, a 50 nm pitch staircase compared to conventional methods which require a 400 nm pitch staircase and sense amplifiers to be built outside of the memory array area.

Figure 2:
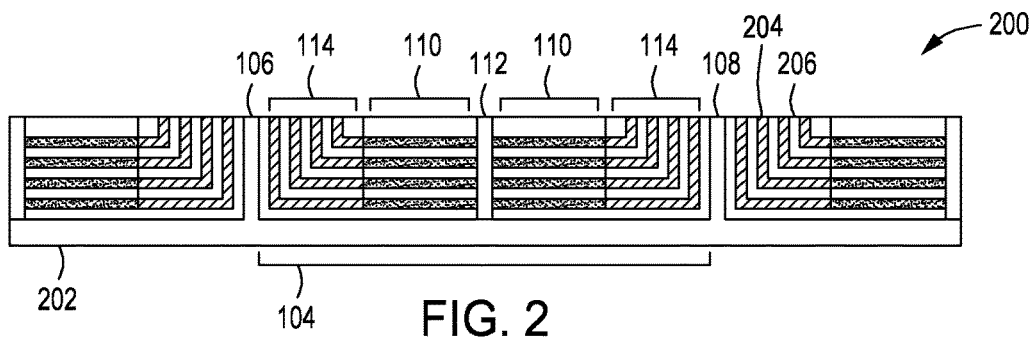
FIG. 2 depicts a cross-sectional view of 3D DRAM arrays in accordance with some embodiments of the present principles.

In a top-down view 100 of FIG. 1, several 3D DRAM cell groups 102 are depicted. A first 3D DRAM cell group 104 has been formed in a gap between a first silicon wall 106 and a second silicon wall 108 created by a silicon substrate etch for the array Si/SiGe deposition. A plurality of 3D DRAM cells 110 with vertical wordlines formed from a plurality of crystalline Si and SiGe layers are formed along with a stack of horizontal bitlines 112 for the 3D DRAM cells 110. Adjacent to the plurality of 3D DRAM cells 110 is a layer access area 114 used to connect to the plurality of 3D DRAM cells 110 and to the stack of horizontal bitlines 112. In a view 200 of FIG. 2, a cross-section of the 3D DRAM cell groups 102 on a substrate 202 is depicted. Si layers 204 alternate with SiGe layers 206 both horizontally (in the areas of the plurality of 3D DRAM cells 110) and vertically (in the layer access area 114). The L-pad formation, formed by the alternating layers created between the silicon walls, presents a starting structure that can be formed into vertical wordlines, bitlines, contact points, and FinFETs and the like.

Figure 3:
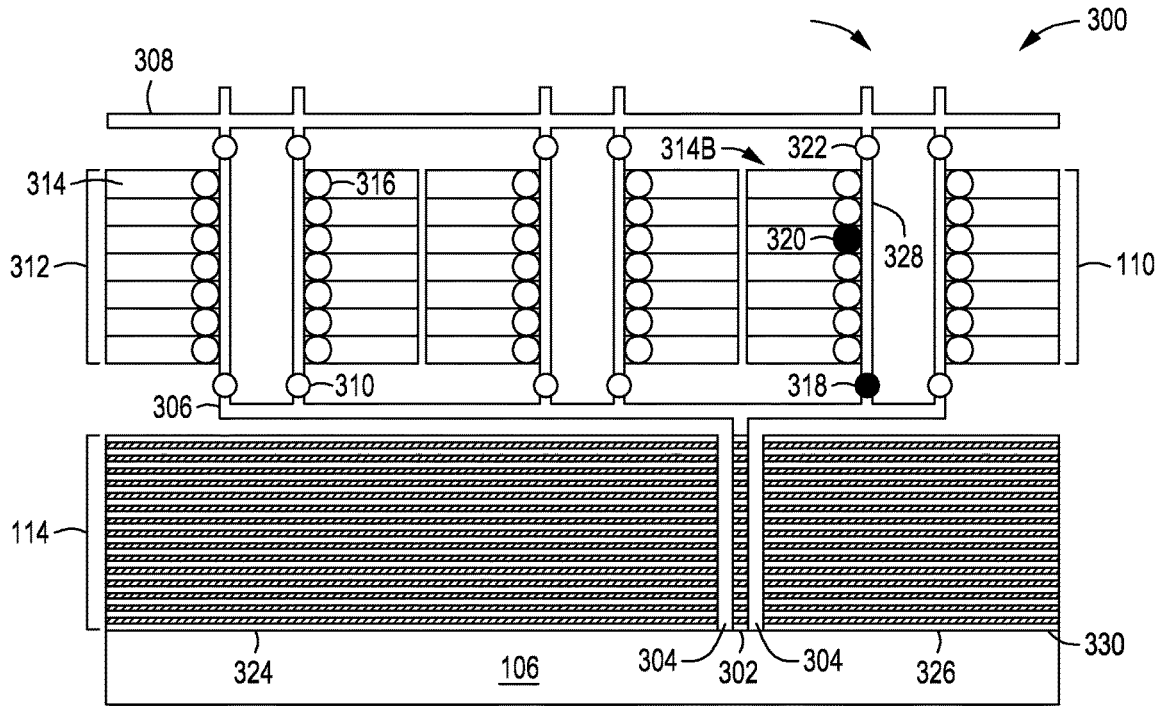
FIG. 3 depicts a top-down view of a hierarchical bitline architecture in accordance with some embodiments of the present principles.

In the top-down view 300 of FIG. 3, a hierarchical bitline architecture is formed using the L-pad formation. A sidewall 330 of the first silicon wall 106 is adjacent to the layer access area 114. The plurality of 3D DRAM cells 110 and the stack of horizontal bitlines 112 are depicted figuratively to better illustrate the switchable connections between the structures. A global bitline access area 302 has been formed by etching trenches 304 into the layer access area 114 to create an electrically isolated area of the layer access area 114 that runs from the sidewall 330 of the first silicon wall 106 to a stack of global bitlines 306. The global bitline access area 302 is further formed by fully etching the SiGe layers from one or both sides in the isolation cuts (trenches 304) and replacing the removed SiGe gaps with dielectric material. The dielectric material provides isolation between the bitline metal layers formed next. The global bitline access area 302 is then further formed by selectively etching the global bitline access area 302 from one or both sides in the trenches 304 to replace the Si material with a metal material to form bitline metal layers in the global bitline access area 302 to provide bitline connectivity to the layers of the 3D DRAM cells. The stack of global bitlines 306 is formed between the layer access area 114 and the 3D DRAM cells 110. A bitline EQ 308 is formed adjacent to the 3D DRAM cells 110 on a side opposite of the stack of global bitlines 306. A local bitline switch 310 may be formed using a vertical wordline gate switch to control the bitline connection to only a single local bitline of 3D DRAM cells 314, dramatically reducing the bitline length and the bitline resistance and capacitance.

Each of the stack of 3D DRAM cells 314 has a wordline switch 316 to gate the access device of each cell so that one stack of memory locations may be accessed to the stack of horizontal bitlines 112. As an example, a local bitline switch 310 has been activated 318 allowing a read or write on a stack of 3D DRAM cells 314B. A wordline switch 316 has been activated 320, allowing access to the local bitline to read or write the cell bit value as required. Only the stack of local bitlines on an active wordline is activated to connect the activated stack of local bitlines 328 to the stack of global bitlines 306. The bitline tier stack deposited on the sidewall of the silicon forms a planar connection point of the stack of global bitlines 306. The bitline tier stack is isolated on either side by a combination of holes, slits, or slot etched features with a lateral recess to form a supported wall of narrow bitline (global bitline access area 302). The inventor has found that the estimated total bitline RC and bitline capacitance is comparable to that of 2D DRAM for even higher density of 3D DRAM. The bitline EQ 308 also has a series of bitline EQ switches 322 that may be activated individually or all together to equalize the stack of global bitlines 306.

As an example, the global bitline access area 302 may formed with 96 bitline metal layers that may be connected to 96 sense amplifiers. The bitline metal layers run vertically down along the sidewall 330 of the first silicon wall 106 and then horizontally towards the stack of global bitlines 306. The stack of global bitlines 306 runs horizontal and consists of the same 96 layers of bitlines in the global bitline access area 302 where the stack of bitlines run vertically up the first silicon wall 106 to be individually accessed from the top surface. Each local bitline switch 310 would control access to an entire tier (96 layers) of the stack of local bitlines for each grouping 312 of 3D DRAM cells 314. When a local bitline switch 310 is activated, only the stack of 96 local bitlines in a grouping 312 would be accessible by the 96 bitline metal layers. Using the approach, a sense amplifier connected to one of the 96 bitline metal layers can be used to access different cell locations without the substantial additional resistance and capacitance of the local bitlines in the non-accessed cell locations (the non-activated local bitlines). Because only the global bitline access area 302 is needed to access the 3D DRAM cells, the remaining portions 324, 326 of the layer access area 114 may be used to form ancillary structures such as FinFETs for sense amplifiers and the like, dramatically reducing the required surface area for the 3D DRAM and supporting circuits. The formation of the L-pad areas, vertical wordline structures, bitline structures, and development of the layer access area 114 for FinFET structures are discussed in more detail below.

Figure 4:
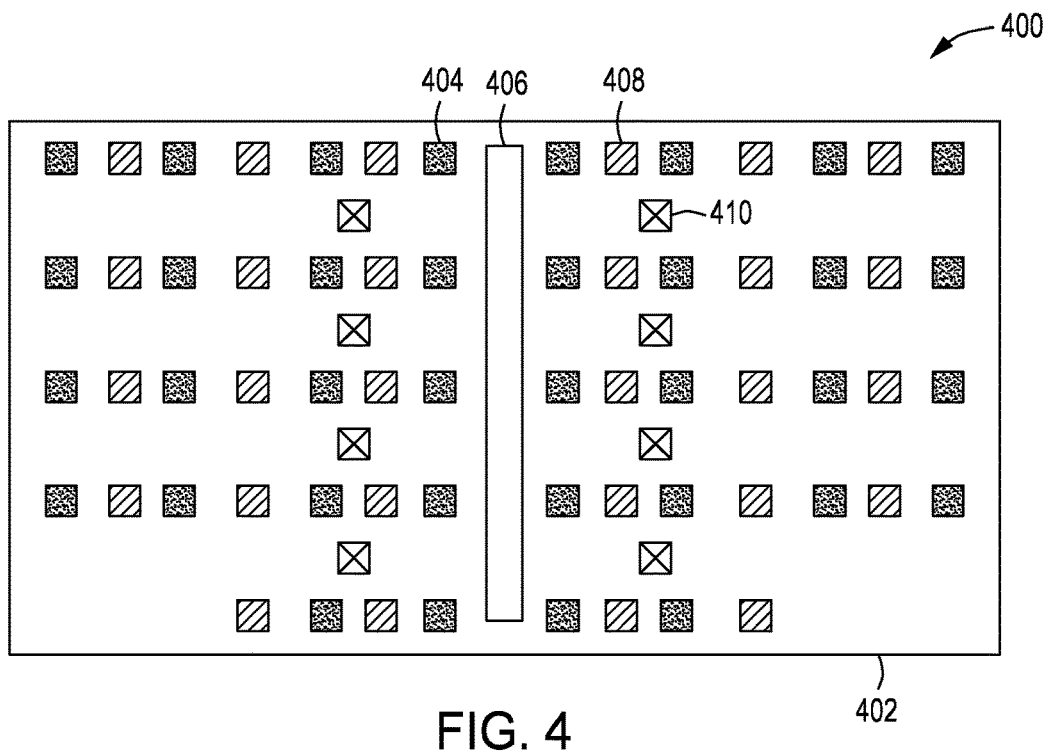
FIG. 4 depicts a top-down view of high aspect ratio hole-based structure formation in accordance with some embodiments of the present principles.
Figure 5:
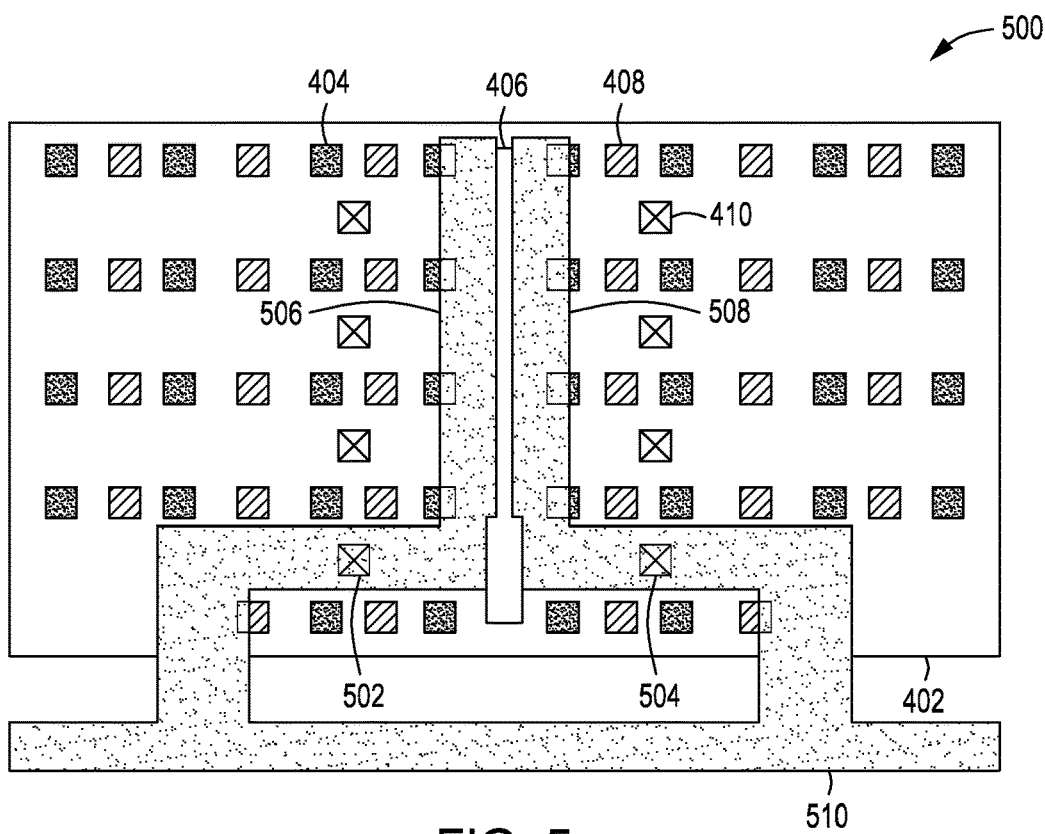
FIG. 5 depicts a top-down view of a 3D DRAM cell layout in accordance with some embodiments of the present principles.

In some embodiments, a method of the present principles uses a stack of alternating crystalline Si/SiGe layers 402 to form different structures using high aspect ratio (HAR) etching of a pattern of holes as depicted in a top-down view 400 of FIG. 4. For example, a first hole type 404 may be used to form a first structure and a second hole type 408 may be used to form a second structure. A third hole type 410 in an example is used to construct a switch by using a transistor formed during the creating of a vertical wordline. In a similar fashion, a slit 406 may be used form a third structure and so forth (e.g., a bitline). In the top-down view 500 of FIG. 5, a version of a 3D DRAM cell layout uses the vertical wordline access transistor 502, 504 to connect or disconnect a local bitline 506, 508 to the global bitline 510. In a similar fashion, other vertical wordline access transistors can be used to connect local bitlines or the global bitlines to the bitline EQ. The bitline slit creates a metal contact to the silicon (metal to source/drain of the vertical wordline transistor). The bitline is placed to coincide with the source/drain region created at the edge of wordline cell to connect the channels.

Figure 6:
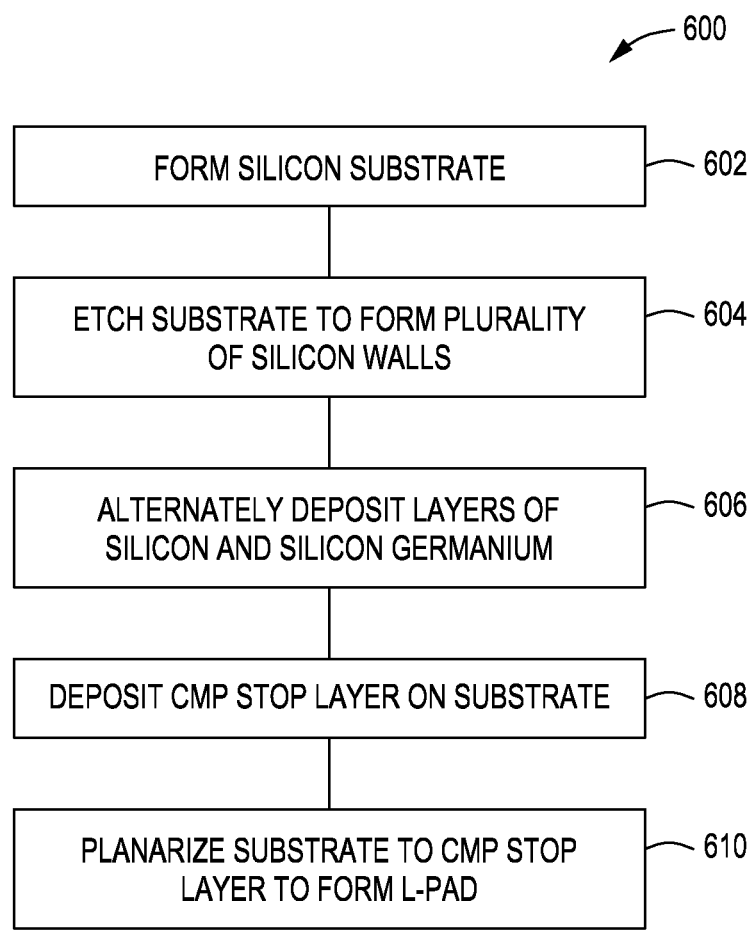
FIG. 6 is a method of L-pad formation in accordance with some embodiments of the present principles.
Figure 7:
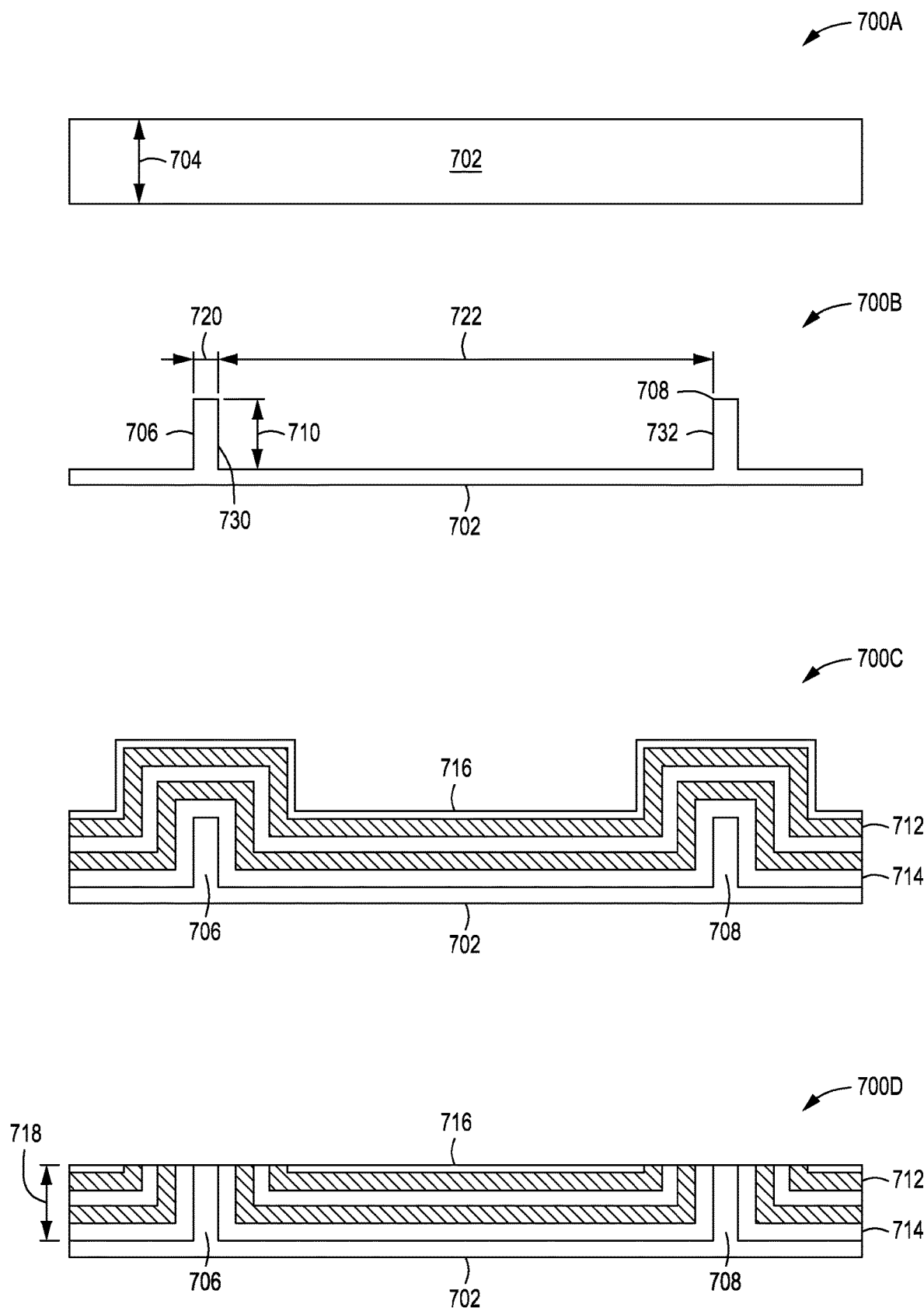
FIG. 7 depicts cross-sectional views of L-pad formation in accordance with some embodiments of the present principles.

FIG. 6 is a method 600 of L-pad formation for 3D DRAM. References to the cross-sectional views 700A-D of FIG. 7 will assist in describing the method 600. In block 602, a substrate 702 of silicon is formed as depicted in cross-sectional view 700A. A thickness 704 of the silicon may vary based upon a desired height of silicon wall used for the L-pad formation. In block 604, the substrate 702 is etched to form a first silicon wall 706 and a second silicon wall 708 as depicted in the cross-sectional view 700B. Any number of silicon walls may be formed during the process and the illustration of two silicon walls is for the sake of brevity. A wall height 710 is selected based on the number of alternating Si/SiGe layers desired for the 3D DRAM cell structures. In some embodiments, a thickness 720 of a sidewall may be approximately 2 microns to approximately 3 microns. The inventor has found that the thickness should be sufficient such that the silicon wall does not bend or collapse for a given height. In some embodiments, the wall height 710 is approximately 10 microns. In some embodiments, the wall height 710 is approximately 2 microns to approximately 20 microns. In some embodiments, a spacing distance 722 between the first silicon wall 706 and the second silicon wall 708 is approximately 60 microns. The spacing is selected to be twice the length of the single local bitline to meet bitline parasitic requirements.

In block 606, crystalline Si layers 712 and crystalline SiGe layers 714 are alternately epitaxially deposited over the substrate 702, including the first silicon wall 706 and the second silicon wall 708 as depicted in the cross-sectional view 700C. In block 608, a chemical mechanical polishing (CMP) stop layer 716 is deposited on the substrate 702 as shown in the cross-sectional view 700C. In block 610, the substrate 702 is planarized below the wall height 710 to a second sidewall height 718 as depicted in the cross-sectional view 700D. Because the crystalline Si layers 712 and the crystalline SiGe layers 714 run horizontally and then vertically up a first sidewall 730 of the first silicon wall 706 and up a second sidewall 732 of the second silicon wall 708, the crystalline Si layers 712 and the crystalline SiGe layers 714 form an "L" shape or an "L-pad." Different portions of the L-pad formation 802 may be used for different 3D DRAM structures as depicted in a cross-sectional view 800 of FIG.

8. In some embodiments, a horizontal portion 804 is used to form 3D DRAM cell structures such as vertical wordline structures and the like (see FIGS. 22 and 23). In some embodiments, the L-shaped portions 806 may be used for a global bitline access area and/or for forming fins for Fin-FETs and the like for sense amplifiers. By using the L-pad formation along with the hole patterning process, 3D DRAM cells and ancillary support structures such as sense amplifiers can be economically produced on the same scale or less than 2D DRAM.

Figure 9:
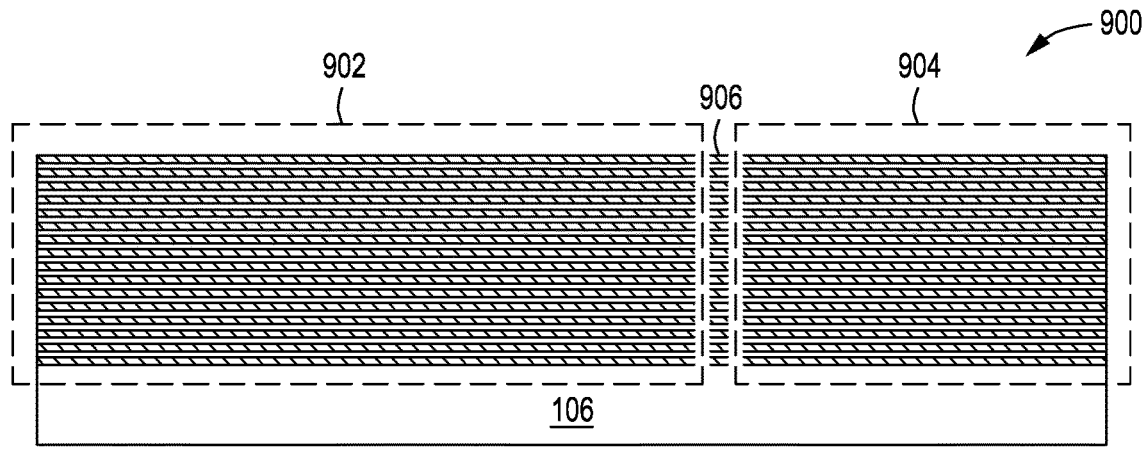
FIG. 9 depicts a top-down view of ancillary structure locations of an L-pad in accordance with some embodiments of the present principles.
Figure 10:
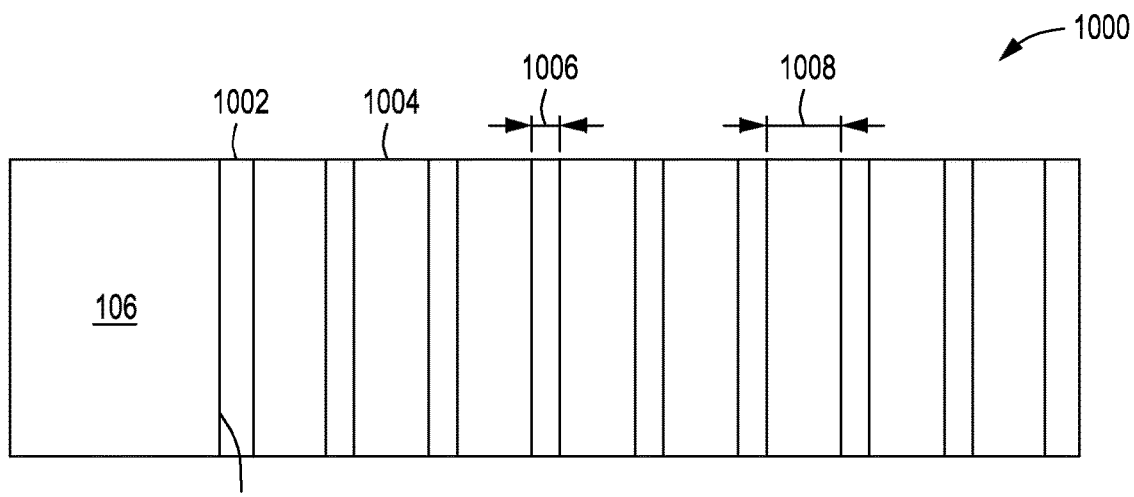
FIG. 10 depicts a cross-sectional view of a portion of an L-pad formation in accordance with some embodiments of the present principles.

As the formation of the vertical wordline structures are discussed below (FIGS. 22 and 23), the processes for forming the fins for the FinFETs are presently discussed. As an example process, a first portion 902 of the L-pad to the left of the global bitline access area 906 and a second portion 904 of the L-pad to the right of the global bitline access area 906 may be processed to produce FinFETs for sense amplifiers and the like as depicted in the top-down view 900 of FIG. 9. In a cross-sectional view 1000 of FIG. 10, the sideview of the first portion 902 or the second portion 904 is depicted. The sidewall 330 of the first silicon wall 106 is positioned oriented to the left with the vertical portions of the Si layers 1004 and the SiGe layers 1002 oriented to the right. In some embodiments, a first width 1006 of the SiGe layers 1002 is approximately 10 nm and a second width 1008 of the Si layers 1004 is approximately 30 nm.

Figure 11:
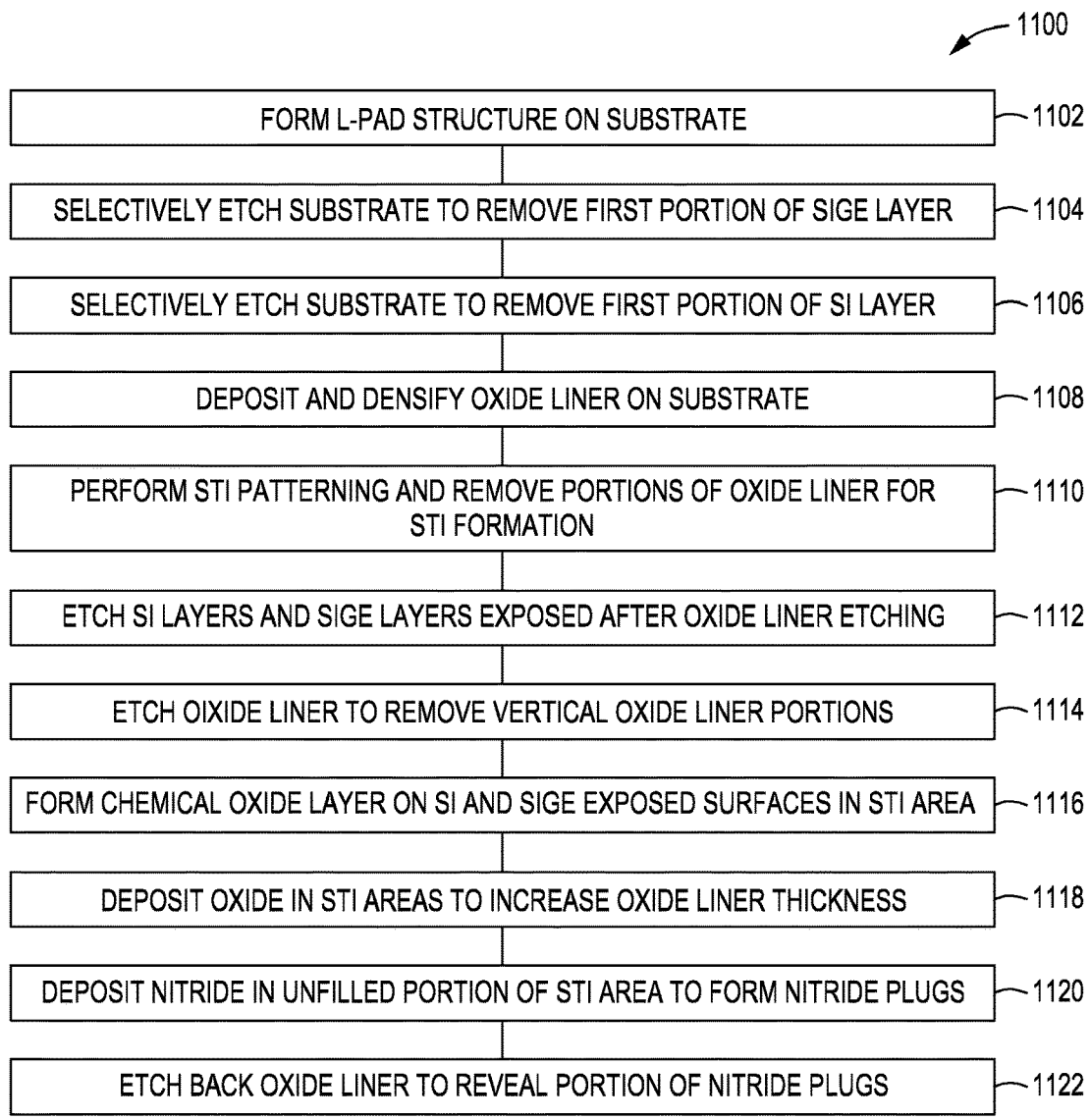
FIG. 11 is a method of forming FinFET structures in an L-pad formation in accordance with some embodiments of the present principles.
Figure 12:
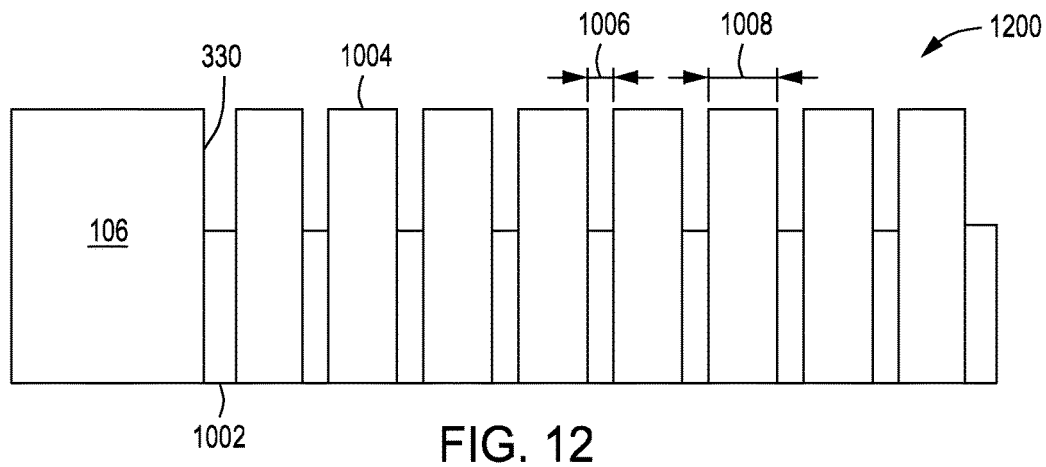
FIG. 12 depicts a cross-sectional view of fin formation of FinFET structures in accordance with some embodiments of the present principles.
Figure 13:
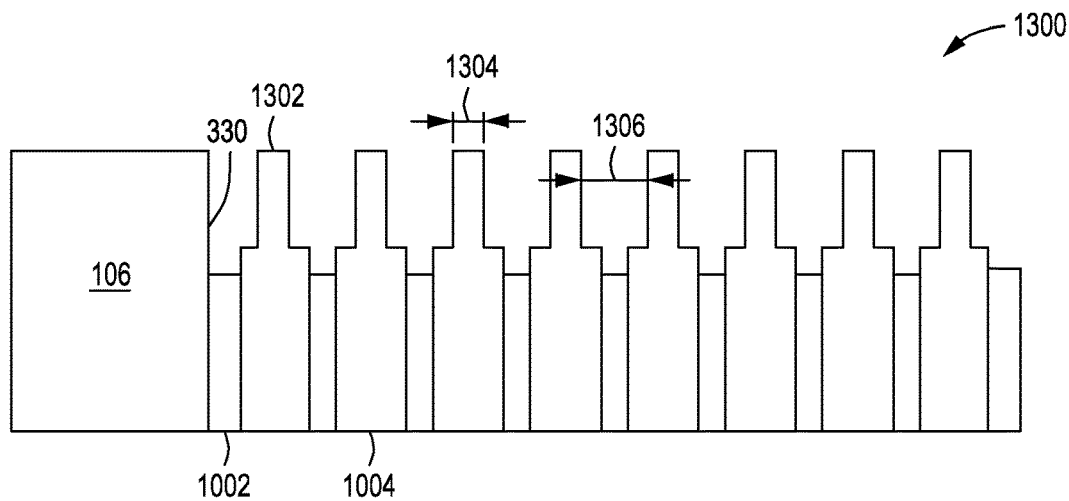
FIG. 13 depicts a cross-sectional view of narrowed fins of FinFET structures in accordance with some embodiments of the present principles.

FIG. 11 is a method 1100 of forming FinFET structures in an L-pad formation. In block 1102, the L-pad structure is created as described above. In some embodiments, memory structures such as, for example, the global bitline access area are also formed, leaving portions of the L-pad formation for use by ancillary structures for the memory cells. The method 1100 forms fins of FinFET structures without requiring self-aligned double patterning (SADP) while providing a well-controlled profile and fin thickness. The method 1100 allows formation of FinFETs with one, two, three, or four or more fins with isolation between the transistors. In block 1104, the SiGe layers 1002 are selectively etched (over the Si layers 1004) to remove a first portion of the SiGe layers 1002 as depicted in a cross-sectional view 1200 of FIG. 12. In block 1106, the Si layers 1004 are selective etched (over the SiGe layers 1002) to remove a first portion of the Si layers 1004 which forms narrow fins 1302 on the Si layers 1004 as depicted in a cross-sectional view 1300 of FIG. 13. In some embodiments, the narrow fins 1302 are approximately 10 nm to approximately 12 nm in width 1304. Narrowing of the FinFET before isolation allows for wider silicon to support the narrow fins 1302 during a subsequent shallow trench isolation (STI) formation.

Figure 14:
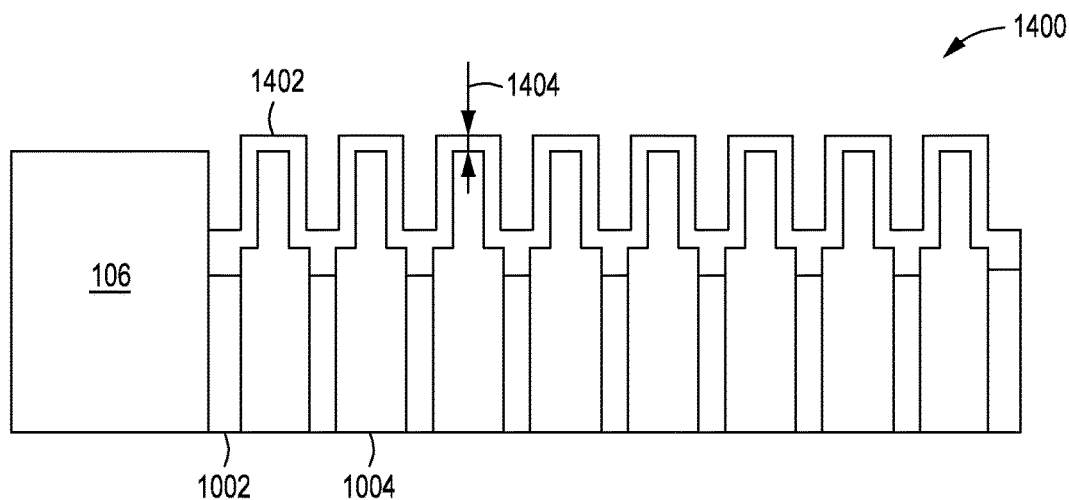
FIG. 14 depicts a cross-sectional view of an oxide liner deposited on FinFET structures in accordance with some embodiments of the present principles.
Figure 15:
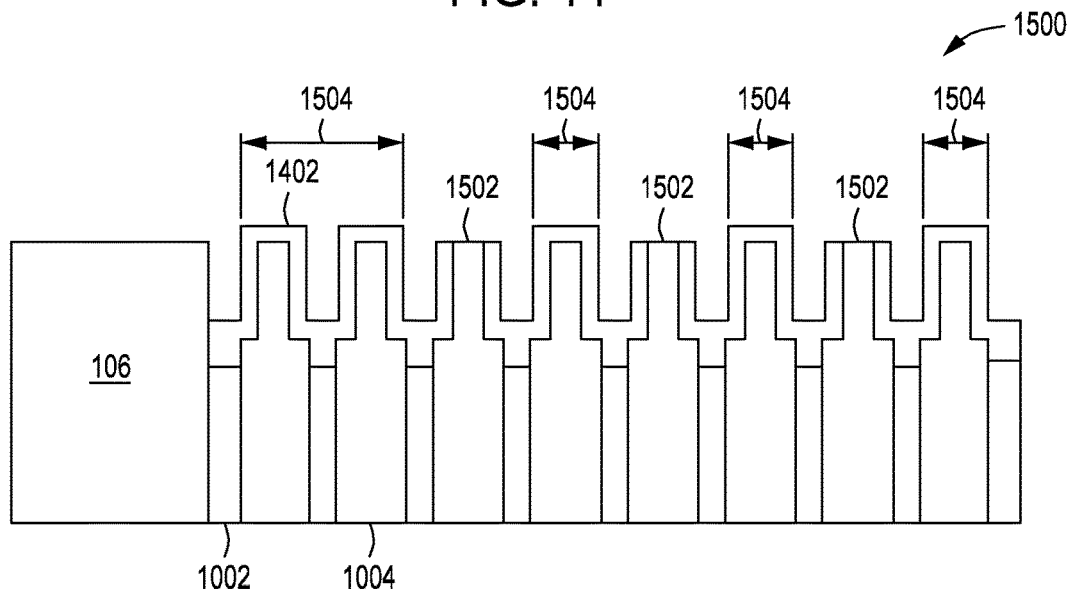
FIG. 15 depicts a cross-sectional view of an oxide liner with removed portions for FinFET structures in accordance with some embodiments of the present principles.
Figure 16:
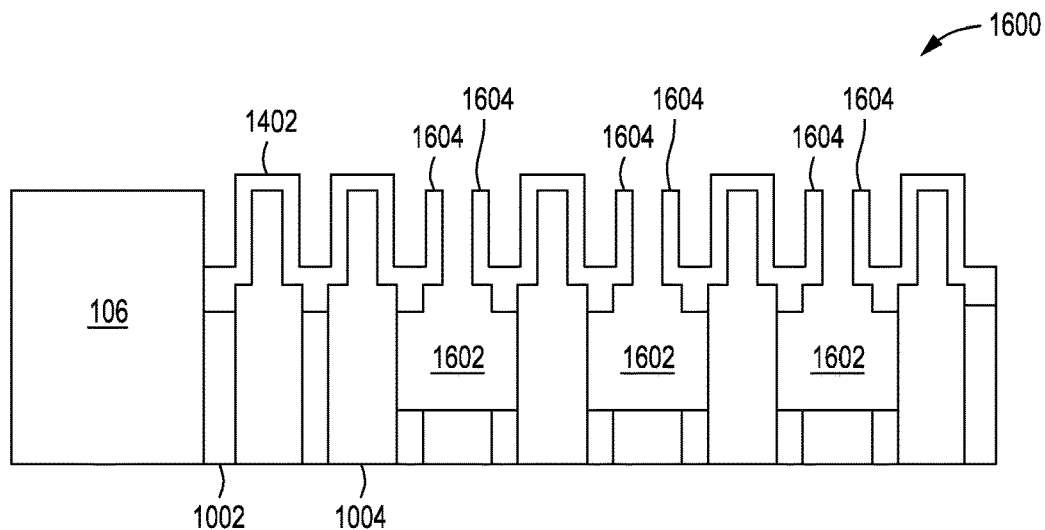
FIG. 16 depicts a cross-sectional view of shallow trench isolation areas for FinFET structures in accordance with some embodiments of the present principles.
Figure 17:
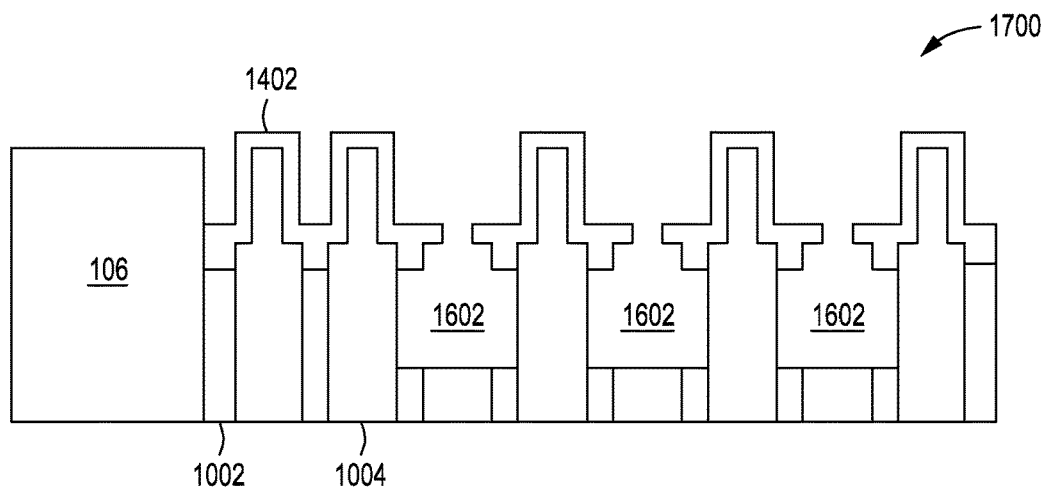
FIG. 17 depicts a cross-sectional view of an oxide liner with removed vertical portions for FinFET structures in accordance with some embodiments of the present principles.
Figure 18:
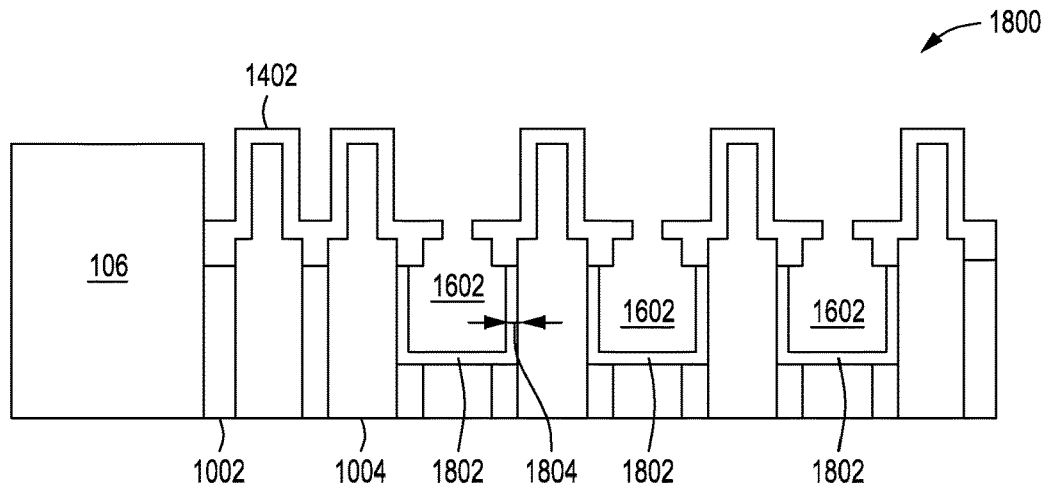
FIG. 18 depicts a cross-sectional view of a chemical oxide layer for FinFET structures in accordance with some embodiments of the present principles.

In some embodiments, the gap 1306 from the SiGe layers 1002 starts at approximately 10 nm and after the Si etching, the gap 1306 increases as the Si layers 1004 are etched to approximately 12 nm and a gap width of approximately 28 nm. In some embodiments, during subsequent processing, the silicon-based fins will be reduced in width further through oxidative loss in a gate pre-clean process and interlayer treatment to be approximately 10 nm in width 1304. In block 1108, an oxide liner 1402 is deposited and densified on the substrate as depicted in a cross-sectional view 1400 in FIG. 14. In some embodiments, the oxide liner 1402 has a thickness 1404 of approximately 6 nm. In block 1110, STI patterning (not shown) covers the active areas 1504 and fins, which will become isolation regions, and portions 1502 of the oxide liner 1402 are then removed as depicted in a cross-sectional view 1500 of FIG. 15. In some embodiments, the STI patterning remains in place to protect gaps of the active area fins. In block 1112, portions of the Si layers 1004 and SiGe layers 1002 exposed after etching the oxide liner 1402 are etched to form STI areas 1602 as depicted in a cross-sectional view 1600 of FIG. 16. In block 1114, oxide liner 1402 to is partially etched to remove vertical oxide liner portions 1604 as depicted in a cross-sectional view 1700 of FIG. 17. In some embodiments, the vertical oxide liner portions 1604 are removed by using a hydrogen fluoride (HF) clean. In block 1116, a chemical oxide layer 1802 is formed on Si and SiGe exposed surfaces within the STI areas 1602 as depicted in a cross-sectional view 1800 of FIG. 18. In some embodiments, the chemical oxide layer 1802 has a thickness 1804 of approximately 3 nm.

Figure 19:
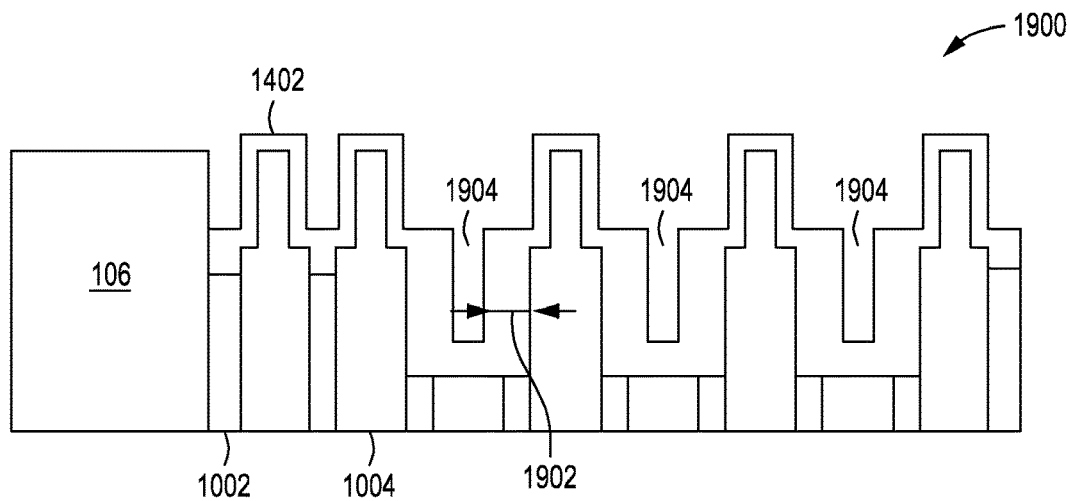
FIG. 19 depicts a cross-sectional view of an oxide liner with increased thickness for FinFET structures in accordance with some embodiments of the present principles.
Figure 20:
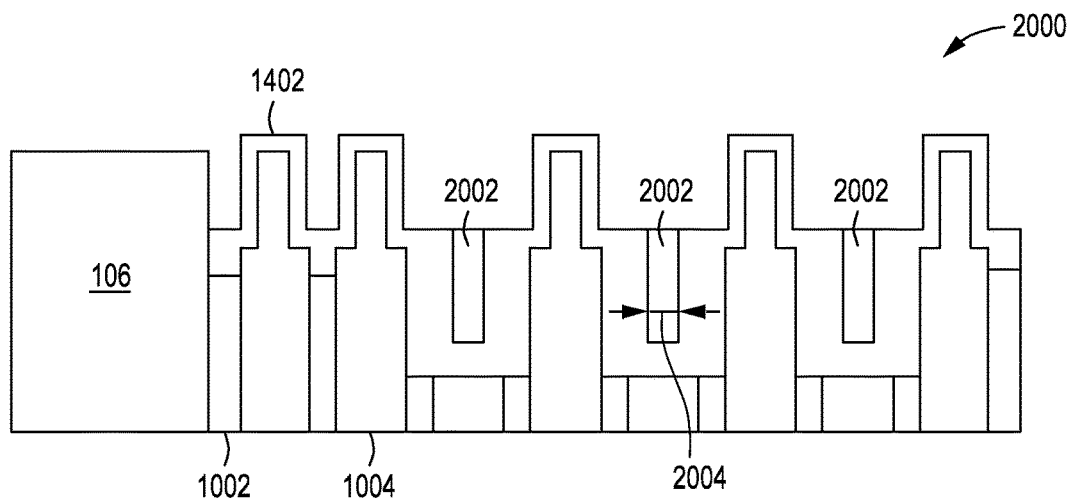
FIG. 20 depicts a cross-sectional view of nitride deposited in shallow trench isolation areas for FinFET structures in accordance with some embodiments of the present principles.
Figure 21:
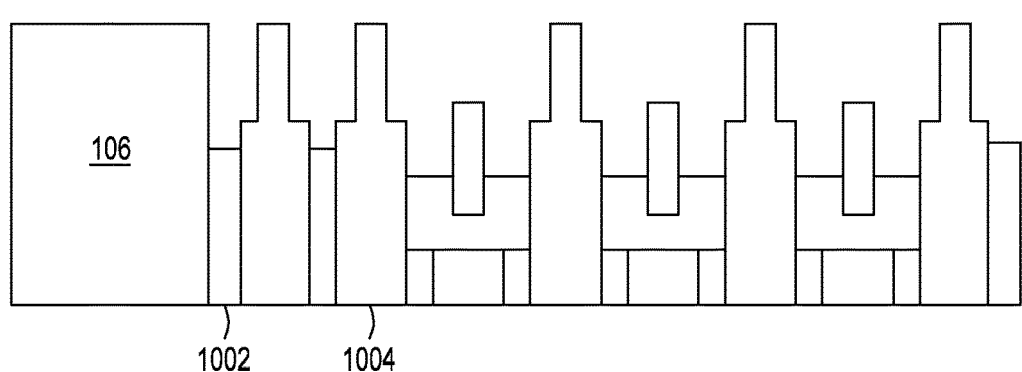
FIG. 21 depicts a cross-sectional view of nitride plugs after etch back processes for FinFET structures in accordance with some embodiments of the present principles.

In block 1118, oxide is deposited in the STI areas 1602 to increase a thickness 1902 of the oxide liner 1402 as depicted in a cross-sectional view 1900 of FIG. 19. In some embodiments, approximately 3 nm of oxide is deposited to partially fill the STI areas 1602. In some embodiments, the thickness 1902 may be approximately 6 nm (approximately 3 nm due to chemical oxide formation and approximately 3 nm from oxide deposition). In block 1120, nitride is deposited in the unfilled portions 1904 of the STI areas 1602 to form nitride plugs 2002 as depicted in a view 2000 of FIG. 20. In some embodiments, the nitride plugs 2002 have a width 2004 of approximately 10 nm. In some embodiments, the STI patterning (not shown) is then removed. In block 1122, the oxide liner 1402 is etched back, exposing a portion of the nitride plugs 2002 while leaving portions of the oxide liner 1402 in the STI areas 1602 as depicted in a cross-sectional view 2100 of FIG. 21. In some embodiments, thermal or in-situ steam generated (ISSG) oxidation processes can be used to etch the STI areas 1602 slower than the deposited liner oxide giving a desired tapered profile for gate etch and electric-field for gate-induced drain leakage (GIDL). The FinFET formation can now be completed using conventional techniques by one skilled in the art which are not described herein for the sake of brevity.

Figure 8:
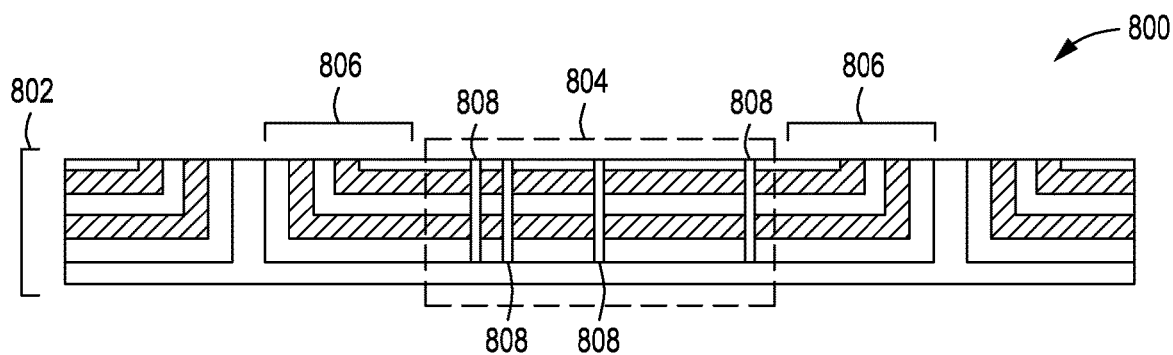
FIG. 8 depicts a cross-sectional view of structure positions in an L-pad formation in accordance with some embodiments of the present principles.
Figure 22:
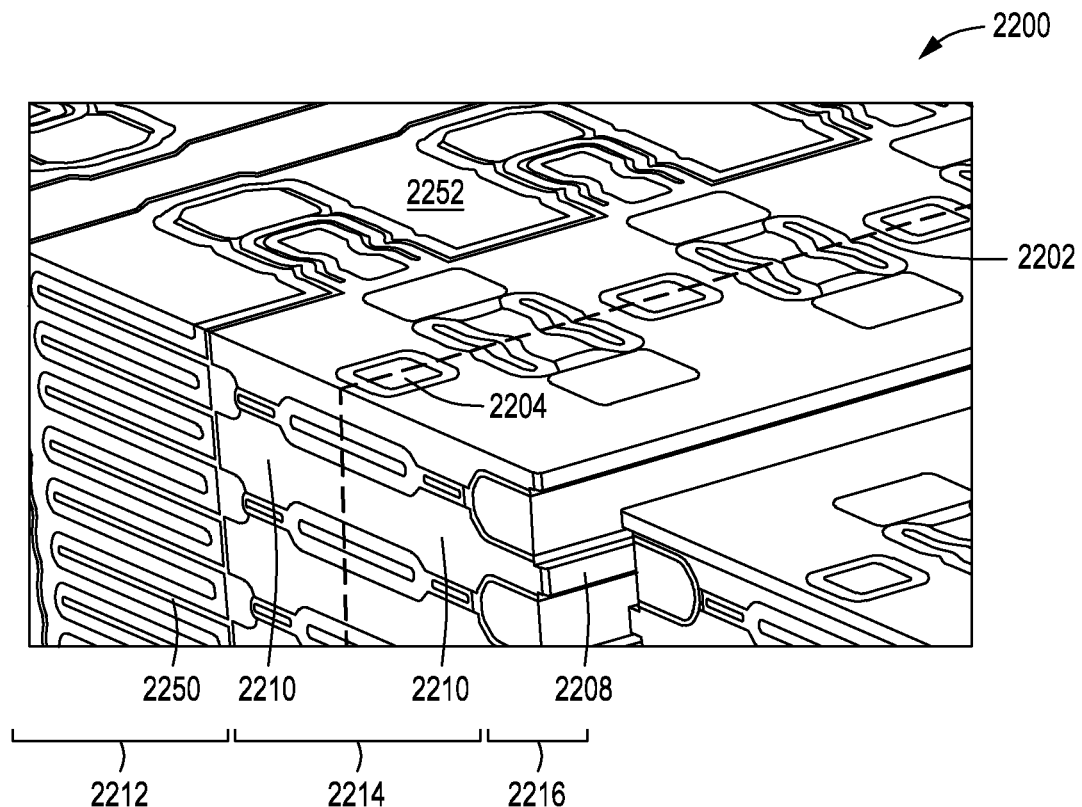
FIG. 22 depicts an isometric view of a 3D DRAM structure in accordance with some embodiments of the present principles.

In some embodiments, a portion of the horizontal portion 804 of FIG. 8 is used to form 3D DRAM cell structures such as vertical wordline structures and the like. FIG. 22 depicts such a vertical wordline structure in an isometric view 2200 in accordance with some embodiments. A capacitor section 2212 is connected to a wordline feature section 2214 which connects with a horizontal bitline feature section 2216. The capacitor section 2212 has lower electrode 2250 and a top electrode 2252. The wordline feature section 2214 includes two source/drain regions 2210. A cut line 2202 is shown in an isometric view 2300 of FIG. 23 to illustrate the internal structure of the 3D DRAM structure through the wordline feature. The wordline hole 2204 is central to a channel and forms two gate all around (GAA) channels 2302 in each intersection of the vertical wordline feature 2306 and the horizontal bitline feature 2208. The vertical wordline features 2306 are separated by isolation features 2304. As the processes described above for formation of the wordline feature are performed, the GAA channels 2302 are also formed.

Figure 23:
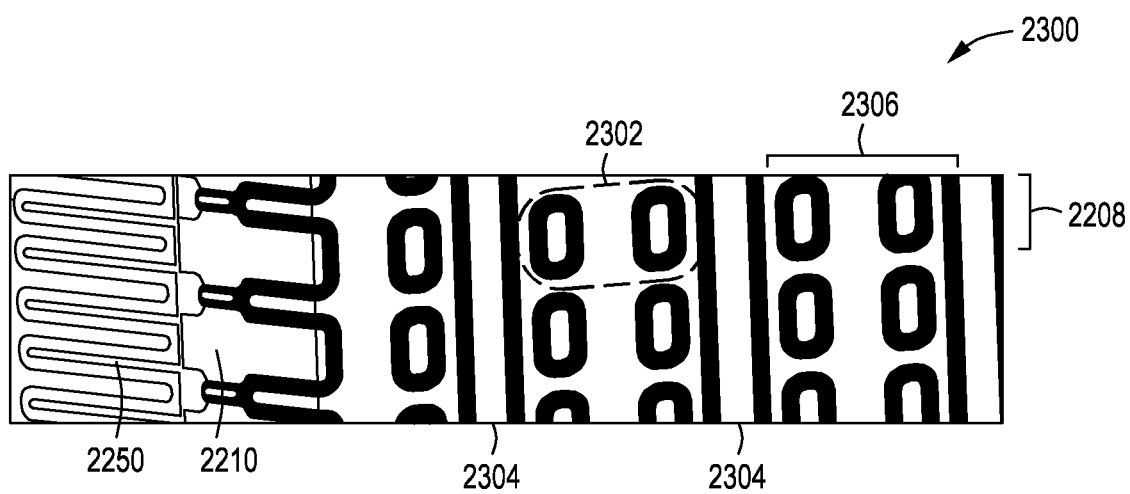
FIG. 23 depicts an isometric view of internal 3D DRAM structure features in accordance with some embodiments of the present principles.

In some embodiments, the vertical wordline transistors may be used as switches to enable the hierarchical bitline architecture as described above. The wordline hole 2204 with the two GAA channels is used for connecting and/or disconnecting the source/drain to source/drain for each 3D DRAM tier for bitline to global bitline, bitline to bitline EQ and/or global bitline to bitline EQ to enable the hierarchical bitline architecture. The vertical wordline structures and connected structures may be formed using the same high aspect ratio etching holes described above for FIG. 4 and the like. Basically, holes 808 are patterned into the alternating crystalline Si and crystalline SiGe epitaxially grown layers of the L-pad in the horizontal portion 804. The holes 808 may then be expanded into slots or slits as needed or lateral etching may be used to selectively open up channels in the SiGe layers and the various features of the vertical wordline, capacitor, or bitline may be formed using atomic layer deposition or chemical vapor deposition techniques as shown in FIGS. 22 and 23.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of forming structures for three-dimensional (3D) dynamic random-access memory (DRAM), comprising:
    etching a substrate to form at least two silicon walls oriented parallel to each other and forming a space therebetween, wherein the at least two silicon walls have a first height;
    depositing a plurality of alternating crystalline silicon layers and crystalline silicon germanium layers using epitaxial growth processes to form horizontal deposition layers on the space between the at least two silicon walls and vertical deposition layers on sidewalls of the at least two silicon walls;
    depositing a chemical mechanical (CMP) stop layer on the substrate; and
    planarizing the substrate to the CMP stop layer, removing a portion of a top of the at least two silicon walls and forming an L-pad formation, wherein the at least two silicon walls have a second height after planarizing that is less than the first height.

2. The method of claim 1, further comprising:
    deep etching a pattern of holes into the space between the at least two silicon walls in horizontal portions of the plurality of alternating crystalline silicon layers and crystalline silicon germanium layers; and
    forming vertical wordline structures from the pattern of holes in the horizontal portions.

3. The method of claim 2, further comprising:
    etching at least two trenches perpendicular to one of the at least two silicon walls, the at least two trenches electrically isolating a global bitline access area formed in the L-pad formation, the global bitline access area configured to provide access to a portion of the plurality of alternating crystalline silicon layers and crystalline silicon germanium layers used to form the vertical wordline structures; and
    replacing the crystalline silicon germanium layers of the global bitline access area with dielectric material and replacing the crystalline silicon layers of the global bitline access area with metal material to form metal bitlines.

4. The method of claim 3, further comprising:
    forming at least one global bitline perpendicular to the global bitline access area and distal to the one of the at least two silicon walls and adjacent to the vertical wordline structures, each one of the at least one global bitline electrically connected to one of at least one of the metal bitlines of the global bitline access area.

5. The method of claim 4, further comprising:
    forming at least one local bitline switch from at least one vertical wordline structure, the at least one local bitline switch configured to electrically connect and disconnect the at least one global bitline to local bitline interfacing with the vertical wordline structures.

6. The method of claim 4, further comprising:
    forming a bitline equilibrate adjacent to the vertical wordline structures but distal to the at least one global bitline; and
    forming at least one bitline equilibrate switch from at least one vertical wordline structure, the at least one bitline equilibrate switch configured to electrically connect and disconnect local bitlines interfacing with the vertical wordline structures.

7. The method of claim 2, further comprising:
    selectively etching vertical portions of the crystalline silicon germanium layers of the L-pad formation to remove a portion of the crystalline silicon germanium layers between vertical portions of the crystalline silicon layers;
    selectively etching vertical portions of the crystalline silicon layers to reduce a thickness of the vertical portions of the crystalline silicon layers to form fins for at least one fin field-effect transistor;
    forming shallow trench isolation areas in the vertical portions of the crystalline silicon layers and the crystalline silicon germanium layers for the fin field-effect transistor; and
    forming nitride plugs in the shallow trench isolation areas for the fin field-effect transistor.

8. The method of claim 1, wherein a first thickness of the at least two silicon walls is approximately 2 microns to approximately 3 microns.

9. The method of claim 1, wherein the first height of the at least two silicon walls is approximately 2 microns to approximately 20 microns.

10. The method of claim 9, wherein the first height of the at least two silicon walls is approximately 10 microns.

11. The method of claim 1, wherein the space between the at least two silicon walls is approximately twice a length of a local bitline.

12. The method of claim 11, wherein the space between the at least two silicon walls is approximately 60 microns.

13. A method of forming structures for three-dimensional (3D) dynamic random-access memory (DRAM) comprising:
    etching a substrate to form at least two silicon walls oriented parallel to each other and forming a space therebetween, wherein the at least two silicon walls have a first height;
    conformally depositing a plurality of alternating crystalline silicon layers and crystalline silicon germanium layers using epitaxial growth processes to form horizontal deposition layers on the space between the at least two silicon walls and vertical deposition layers on sidewalls of the at least two silicon walls;

depositing a chemical mechanical (CMP) stop layer on the substrate;

planarizing the substrate to the CMP stop layer, removing a portion of a top of the at least two silicon walls and forming an L-pad formation, wherein the at least two silicon walls have a second height after planarizing that is less than the first height;

selectively etching vertical portions of the crystalline silicon germanium layers of the L-pad formation to remove a portion of the crystalline silicon germanium layers between vertical portions of the crystalline silicon layers;

selectively etching vertical portions of the crystalline silicon layers to reduce a thickness of the vertical portions of the crystalline silicon layers to form fins for at least one fin field-effect transistor;

forming shallow trench isolation areas in the vertical portions of the crystalline silicon layers and the crystalline silicon germanium layers for the fin field-effect transistor; and forming nitride plugs in the shallow trench isolation areas for the fin field-effect transistor.

14. The method of claim 13, wherein the thickness of the fins is approximately 10 nm to approximately 12 nm.

15. The method of claim 13, further comprising:
depositing a first oxide layer on the crystalline silicon layers and the crystalline silicon germanium layers after selectively etching vertical portions of the crystalline silicon layers;

densifying the first oxide layer;

forming the shallow trench isolation areas by etching a least one portion of the first oxide layer to expose at least one end of a vertical crystalline silicon layer and etching the vertical crystalline silicon layer and adjacent vertical silicon germanium layers; and depositing a second oxide layer in the shallow trench isolation areas to partially fill the shallow trench isolation areas.

16. The method of claim 15, wherein a combined thickness of the first oxide layer and the second oxide layer in the shallow isolation areas is approximately 6 nm.

17. A non-transitory, computer readable medium having instructions stored thereon that, when executed, cause a method of forming structures for three-dimensional (3D) dynamic random-access memory (DRAM) to be performed, the method comprising:

etching a substrate to form at least two silicon walls oriented parallel to each other and forming a space therebetween, wherein the at least two silicon walls have a first height;

depositing a plurality of alternating crystalline silicon layers and crystalline silicon germanium layers using epitaxial growth processes to form horizontal deposition layers on the space between the at least two silicon walls and vertical deposition layers on sidewalls of the at least two silicon walls;

depositing a chemical mechanical (CMP) stop layer on the substrate; and planarizing the substrate to the CMP stop layer, removing a portion of a top of the at least two silicon walls and forming an L-pad formation, wherein the at least two silicon walls have a second height after planarizing that is less than the first height.

18. The non-transitory, computer readable medium of claim 17, the method further comprising:
deep etching a pattern of holes into the space between the at least two silicon walls in horizontal portions of the plurality of alternating crystalline silicon layers and crystalline silicon germanium layers; and forming vertical wordline structures from the pattern of holes in the horizontal portions.

19. The non-transitory, computer readable medium of claim 18, the method further comprising:
etching at least two trenches perpendicular to one of the at least two silicon walls, the at least two trenches electrically isolating a global bitline access area formed in the L-pad formation, the global bitline access area configured to provide access to a portion of the plurality of alternating crystalline silicon layers and crystalline silicon germanium layers used to form the vertical wordline structures;

replacing the crystalline silicon germanium layers of the global bitline access area with dielectric material and replacing the crystalline silicon layers of the global bitline access area with metal material to form metal bitlines;

forming at least one global bitline perpendicular to the global bitline access area and distal to the one of the at least two silicon walls and adjacent to the vertical wordline structures, each one of the at least one global bitline electrically connected to one of at least one of the metal bitlines of the global bitline access area;

forming at least one local bitline switch from at least one vertical wordline structure, the at least one local bitline switch configured to electrically connect and disconnect the at least one global bitline to local bitline interfacing with the vertical wordline structures;

forming a bitline equilibrate adjacent to the vertical wordline structures but distal to the at least one global bitline; and forming at least one bitline equilibrate switch from at least one vertical wordline structure, the at least one bitline equilibrate switch configured to electrically connect and disconnect local bitlines interfacing with the vertical wordline structures.

20. The non-transitory, computer readable medium of claim 17, the method further comprising:
selectively etching vertical portions of the crystalline silicon germanium layers of the L-pad formation to remove a portion of the crystalline silicon germanium layers between vertical portions of the crystalline silicon layers;

selectively etching vertical portions of the crystalline silicon layers to reduce a thickness of the vertical portions of the crystalline silicon layers to form fins for at least one fin field-effect transistor;

forming shallow trench isolation areas in the vertical portions of the crystalline silicon layers and the crystalline silicon germanium layers for the fin field-effect transistor; and forming nitride plugs in the shallow trench isolation areas for the fin field-effect transistor.

* * * * *